United States Patent
Pfahnl et al.

[11] Patent Number: 6,036,023
[45] Date of Patent: Mar. 14, 2000

[54] HEAT-TRANSFER ENHANCING FEATURES FOR SEMICONDUCTOR CARRIERS AND DEVICES

[75] Inventors: Andreas C. Pfahnl, Londonderry; Alexander H. Slocum, Bow, both of N.H.; John H. Lienhard, V, Lexington, Mass.

[73] Assignee: Teradyne, Inc., Boston, Mass.

[21] Appl. No.: 08/890,917

[22] Filed: Jul. 10, 1997

[51] Int. Cl.[7] .................................................. B65D 85/42
[52] U.S. Cl. ........................... 206/725; 206/714; 220/507
[58] Field of Search .................................. 206/719, 725, 206/509, 511, 714; 220/507

[56] References Cited

U.S. PATENT DOCUMENTS

| | | | |
|---|---|---|---|
| 2,146,925 | 2/1939 | Ahrbecker et al. ..................... | 206/511 |
| 3,283,992 | 11/1966 | Hanson et al. ....................... | 206/509 X |
| 4,081,151 | 3/1978 | Ender et al. ......................... | 206/509 X |
| 4,695,707 | 9/1987 | Young . | |
| 4,926,118 | 5/1990 | O'Connor et al. . | |
| 5,103,976 | 4/1992 | Murphy ............................... | 206/725 X |
| 5,131,535 | 7/1992 | O'Connor et al. . | |
| 5,155,579 | 10/1992 | AuYeung . | |
| 5,180,974 | 1/1993 | Mitchell et al. . | |
| 5,184,068 | 2/1993 | Twigg et al. . | |
| 5,203,452 | 4/1993 | Small et al. . | |
| 5,263,583 | 11/1993 | Ohashi ................................ | 206/725 X |
| 5,290,134 | 3/1994 | Baba . | |
| 5,310,076 | 5/1994 | Burton et al. . | |
| 5,313,156 | 5/1994 | Klug et al. . | |
| 5,335,771 | 8/1994 | Murphy ................................... | 206/725 |
| 5,400,904 | 3/1995 | Maston, III et al. . | |
| 5,418,692 | 5/1995 | Nemoto ............................... | 206/725 X |
| 5,427,536 | 6/1995 | Petersen et al. . | |
| 5,481,438 | 1/1996 | Nemoto ............................... | 206/725 X |
| 5,492,223 | 2/1996 | Boardman et al. ................. | 206/725 X |
| 5,547,082 | 8/1996 | Royer et al. ............................ | 206/725 |
| 5,551,572 | 9/1996 | Nemoto ................................... | 206/725 |
| 5,584,707 | 12/1996 | Volz et al. . | |
| 5,746,319 | 5/1998 | Murphy ................................... | 206/725 |

FOREIGN PATENT DOCUMENTS

| | | |
|---|---|---|
| 4338071 | 5/1995 | Germany . |
| 2040437 | 8/1980 | United Kingdom . |
| WO93/20678 | 10/1993 | WIPO . |

*Primary Examiner*—Bryon P. Gehman

[57] ABSTRACT

Convective heat transfer enhancement features are formed in trays for carrying and thermally conditioning semiconductor devices or on integrated circuit chip packages. Upward extending ribs, perpendicular to a fluid flow, are formed in the trays and/or packages for increasing the mixing of the fluid flow near the devices under test, thereby enhancing convective heat transfer to or from the devices. Downward extending ribs are also formed in the trays and/or packages. The upward and downward extending ribs formed in the trays are in a staggered relationship for facilitating the stacking of trays. Alternatively, a surface roughness is applied to the trays and/or packages. The surface roughness applied to the packages is such that sufficient smooth regions remain on the packages for allowing pick-and-place machines to handle the packages.

11 Claims, 18 Drawing Sheets

HEAT-TRANSFER ENHANCING FEATURES FOR SEMICONDUCTOR CARRIERS AND DEVICES

This invention relates generally to semiconductor devices such as integrated circuits (ICs) and to carriers used to house, handle, or ship them, and more particularly to features of the devices and the carriers that enhance heat transfer to the devices and the carriers.

Even after semiconductor chips are packaged, they continue to undergo a variety of different manufacturing processes and tests, many of which are performed at temperatures higher or lower than the typical room temperature of 20 to 30 degrees Celsius. Examples of such back-end processes include, but are not limited to, temperature testing where test handlers present trays of thermally conditioned devices (i.e., devices at the desired higher or lower temperature) to a tester, and burn-in testing where trays of devices are stacked in thermal chambers and subject to long-term tests at similar extreme temperatures. For these processes, manufacturers demand greater throughput performance and smaller machine sizes to reduce semiconductor device costs.

Throughput of such back-end processing equipment is often governed by the time needed to bring the devices to the desired set-point temperature, sometimes called the "thermal soak time". Throughput can be improved by increasing the size of the thermal conditioning chambers, where the devices are brought to the set-point temperature, so that the chambers can hold more devices simultaneously. However, the size of machines used in such processing is heavily influenced by the thermal conditioning chamber size. Because of the high capital cost of semiconductor processing equipment, low throughput is very undesirable. But, because of the high cost of maintaining floor space in a semiconductor processing plant, increasing the size of processing machines is also undesirable. Thus, there is great economic incentive for cheaply and efficiently decreasing thermal soak time without significantly increasing the size of the processing machines.

One way that semiconductor devices are brought to a desired set point is by forced convection heat transfer. A fluid (usually air) is blown across the devices sitting in a series of spaced trays. We have recognized that the thermal-soak time is governed primarily by whether the flow is laminar or turbulent. For turbulent flows, the surface characteristics of the passage, in this case the trays and the devices, have significant influence on the heat transfer to the devices and the trays. As discussed herein, no prior art considers tray or device-package features that take advantage of the surface characteristics to increase, optimize, or maximize the convective heat transfer to the trays or the devices in these trays.

Heat-transfer enhancing requirements for ICs exist in other applications, namely in the product or application in which the device is installed. In these instances, it is often necessary to design the ICs with heat-transfer enhancing components or install them in the actual application with additional heat-transfer enhancing components. The purpose is to provide a means of cooling those ICs that generate large amounts of heat when in use under certain ambient conditions. In this respect, much prior art focuses on heat transfer fins directly attached to ICs. These fins, or heat sinks, enhance the conduction heat transfer from the device by substantially increasing the heat-transfer surface area. Other prior art includes the heat-transfer research by Sparrow et al., "Heat Transfer and Pressure Drop Characteristics of Arrays of Rectangular Modules Encountered in Electronic Equipment," Int. J. Heat Mass Transfer, Vol. 25, No. 7, pp. 961–973, 1982. This work documents the use of a rib on a computer board with surface-mount ICs to improve the heat transfer from devices located downstream of the rib.

Device carriers exist in prior art as many different embodiments. The most widely accepted embodiments are those defined by the JEDEC (Joint Electronic Device Engineering Council). Significant leeway is provided to allow manufacturers to specify different or additional features that locate and retain the devices. Prior art includes patents of tray designs and feature designs, which can be incorporated into JEDEC or generic carriers. Examples of such prior art are found in the following patents:

U.S. Pat. No. 5,103,976 (1992) to Murphy—Murphy discloses a tray design with cross-ribbing that forms pockets where semiconductor chips can be placed. Additional ribbing inside the pocket areas support and locate Pin-Grid Array (PGA) semiconductor ICs.

U.S. Pat. No. 5,203,452 (1993) to Small et al.—Small et al. discloses a tray design with pockets defined by vertical walls extending from the outer frame work.

U.S. Pat. No. 5,263,583 (1993) to Ohashi—Ohashi discloses a tray design for transporting Plastic Leaded Chip Carrier (PLCC) ICs. Vertical structural walls stand off a height above or equal to the top surface of the device in the tray;

U.S. Pat. No. 5,335,771 (1994) to Murphy—Murphy discloses a tray spacer with reference to a tray for housing PGA components. The tray has ribs or walls that define the pockets and support PGA ICs from underneath between the ribs;

U.S. Pat. No. 5,400,904 (1995) to Maston et al.—Maston discloses a tray design that holds Ball-Grid Array (BGA) ICs. Support structures or ribs are described that restrain the chips in defined locations;

U.S. Pat. No. 5,418,692 (1995) to Nemoto—Nemoto discloses a tray for semiconductor devices. Pockets are defined by vertical ribs that also serve to support trays stacked on top. Ribs extending a short distance underneath the pockets serve to locate and restrain the devices of the tray stacked below. The ribs are described as being taller than the upper surface of the device being carried;

U.S. Pat. No. 5,481,438 (1996) to Nemoto—Similar to U.S. Pat. No. 5,418,692 cited above;

U.S. Pat. No. 5,551,572 (1996) to Nemoto—Nemoto discloses a tray for BGA ICs. He incorporates ribs that are formed on the four corners with additional downward extending ribs to fit between the spaces of rib openings at the top of the next lower tray.

Other prior art of carriers or trays include generic embodiments that provide a means of processing devices through various machines. Examples with specific reference to the requirement of carriers for thermal processing include the following patents:

U.S. Pat. No. 4,695,707 (1987) to Young—Young discloses a heating oven primarily for burning-in or aging semiconductor ICs. Details and designs of the trays for this equipment are disclosed, but with regard to features for locating and positioning the devices in the tray;

U.S. Pat. No. 4,926,118 (1990) to O'Connor et al.—O'Connor et al. disclose a test station using a tray similar to U.S. Pat. No. 5,131,535 cited below, which can be used in all back-end processes;

U.S. Pat. No. 5,131,535 (1992) to O'Connor et al.—O'Connor et al. disclose a tray design for any back-end process. Details and designs are disclosed of features for locating and positioning the devices in the tray;

U.S. Pat. No. 5,180,974 (1993) to Mitchell et al.—Mitchell et al. disclose a tray design that is used for testing, marking, inspecting and shipping semiconductor ICs. Details and designs are disclosed of features for locating and positioning the devices in the tray;

U.S. Pat. No. 5,184,068 (1993) to Twigg et al.—Twigg et al. disclose a handler, in which devices are transferred from a customer-specific tray to the handler tray and then taken through temperature soak and de-soak chambers. No details of this tray are disclosed besides that it carries the devices through the temperature soak and de-soak chambers;

U.S. Pat. No. 5,290,134 (1994) to Baba—Baba discloses a pick-and-place system that uses a special tray to process the devices in the handler. The only details of the tray disclosed refer to the positioning and retention features; and U.S. Pat. No. 5,313,156 (1994) to Klug et al.—Klug et al. discloses an apparatus for automatic handling of semiconductor ICs, in which devices are transferred from a customer-specific tray to the handler tray and then taken through temperature soak and de-soak chambers. No details of this tray design are disclosed except that it carries the devices through the temperature soak and de-soak chambers.

Indeed, we have found that tray designs for thermal conditioning devices fundamentally do not appreciate the physics of turbulent heat transfer, which is an advanced subject, and thus they have missed an opportunity for detail that can greatly increase the performance of semiconductor manufacturing machines.

Prior art relating to heat-transfer enhancing features of semiconductor packages encompass fin designs or heat-transfer plates that are externally mounted onto or integrally molded into the device package. Their purpose is to provide a means of cooling devices when operational by enhancing the heat conduction through increased surface area. On the other hand, a vast majority of devices exist that do not require fins or heat transfer enhancing features to operate, yet fins would be desirable to aid in manufacturing the devices themselves. If the intent were for manufacturing reasons alone, integration of a fin into the device is difficult to realize because the typically large required fin sizes prevent the chip from being processed through many manufacturing machines. Moreover, the significant increase in size because of attached or protruding fins is a significant disadvantage for their use in many space-constrained applications. Nonetheless, heat-transfer enhancing features would be desirable for speeding and reducing the cost of manufacturing ICs, whenever they need to be thermally conditioned. Also, more cost-effective, compact and effective heat-transfer enhancing features other than fins would also be desirable for ICs that do require cooling when operational.

As a typical example, consider the prior art in the U.S. Pat. No. 5,155,579 in which AuYeung discloses heat-transfer enhancing fins integrally molded with the semiconductor package. One object as disclosed is to provide a more effective means of removing heat from the chip through the package, when the device is operational in the intended application or product. The fins are disclosed as geometric entities extending from the package surface. This invention does not relate to the present invention, since it addresses the use of fins. The physics and benefits of are very different than the benefits of surface features as discussed herein which are turbulent-flow heat-transfer enhancing or inducing features.

SUMMARY OF THE INVENTION

With the foregoing background in mind, it is an object of the invention to increase the throughput of semiconductor processing equipment with a thermal soak chamber without significantly increasing the size of the equipment.

It is also an object to reduce the thermal soak time of devices that need to be thermally conditioned in manufacturing processes.

It is a further object of this invention to reduce the overall required soak chamber size by reducing the time needed to bring the semiconductor ICs to the set-point temperature.

It is a further object of this invention to enhance heat-transfer by utilizing tray and device features while maintaining the ability to stack similar trays, one on above the other, for general shipping or handling purposes.

It is a further object of this invention to include heat-transfer enhancing features on the device package surface itself, while maintaining the ability to keep an overall compact package and to allow the device to be individually handled by pick-and-place operations, some of which, for example, use suction cups.

The foregoing and other objects are achieved by enhancing the heat-transfer to or from ICs that are housed in trays spaced apart or ICs mounted on computer cards spaced apart, so that a heat-transfer fluid, such as air, flows between the trays or the cards. The invention being disclosed provides this heat-transfer enhancement by adding surface geometric features to a surface of an IC or a tray exposed to the surrounding flow. These surface features enhance the heat transfer in turbulent flows by inducing greater mixing between the fluid in the core (i.e., in the center region of a flow channel) and the fluid close to the surface, and by disrupting heat-transfer reducing flow regions that might develop between the core and the surface.

In a preferred embodiment, the heat transfer is enhanced under turbulent flow by adding carefully-sized ribs to the top surface of the tray before each IC location, and/or adding similar ribbing to the underside of the tray, and/or adding ribbing to the surface of the semiconductor package, and/or adding a surface roughness to the semiconductor package, and/or adding a roughness to the underside surfaces of the tray which may exist to support the semiconductor IC.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
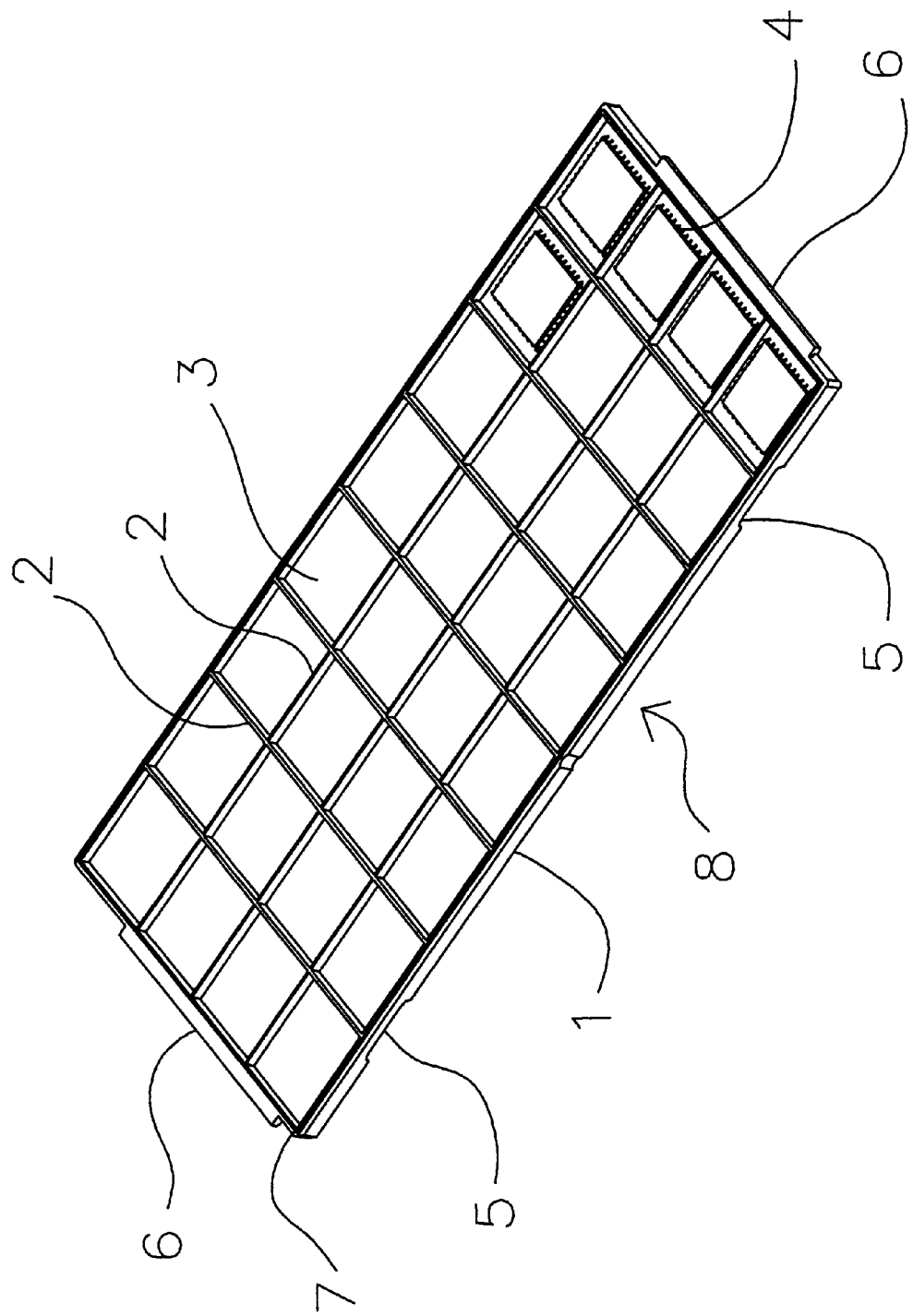
FIG. 1 is a perspective view of a prior art JEDEC-standard tray carrying five generic semiconductor devices.

Referring to a traditional JEDEC-standard carrier/tray in FIG. 1, device tray 8 is characterized by frame 1 and network of ribs 2 that define pockets 3 in which some type of device 4 is housed. Four slots 5 molded into frame 1 and tabs 6 on the lengthwise ends of the tray further characterize these JEDEC-standard trays. Frame 1 also has step feature 7 to allow similar trays to be stacked. Generic ribs 2 and the bases that define the bottom of pockets 3 provide the minimum amount of structural stiffness necessary to protect and support the devices.

The present invention is illustrated in subsequent embodiments in four different ways, two of which are applied to an IC carrier such as a tray and the others to an IC package. Referring to FIG. 1, the present invention is illustrated first as specific constructions and uses of tray ribs 2, which can also serve the traditional purpose of defining pockets 3 that carry devices 4. The specific constructions and uses of ribs 2 as in the present invention can provide significant heat-transfer enhancement to the tray and to the devices. Secondly, the present invention is illustrated as different embodiments of the exposed surfaces of a carrier, more specifically as designed-in roughness. Thirdly, the invention is illustrated as ribs on the exposed surfaces of an IC package. Finally, the invention is illustrated as further embodiments of the exposed surfaces of an IC package, more specifically as designed-in roughness.

Figure 2:
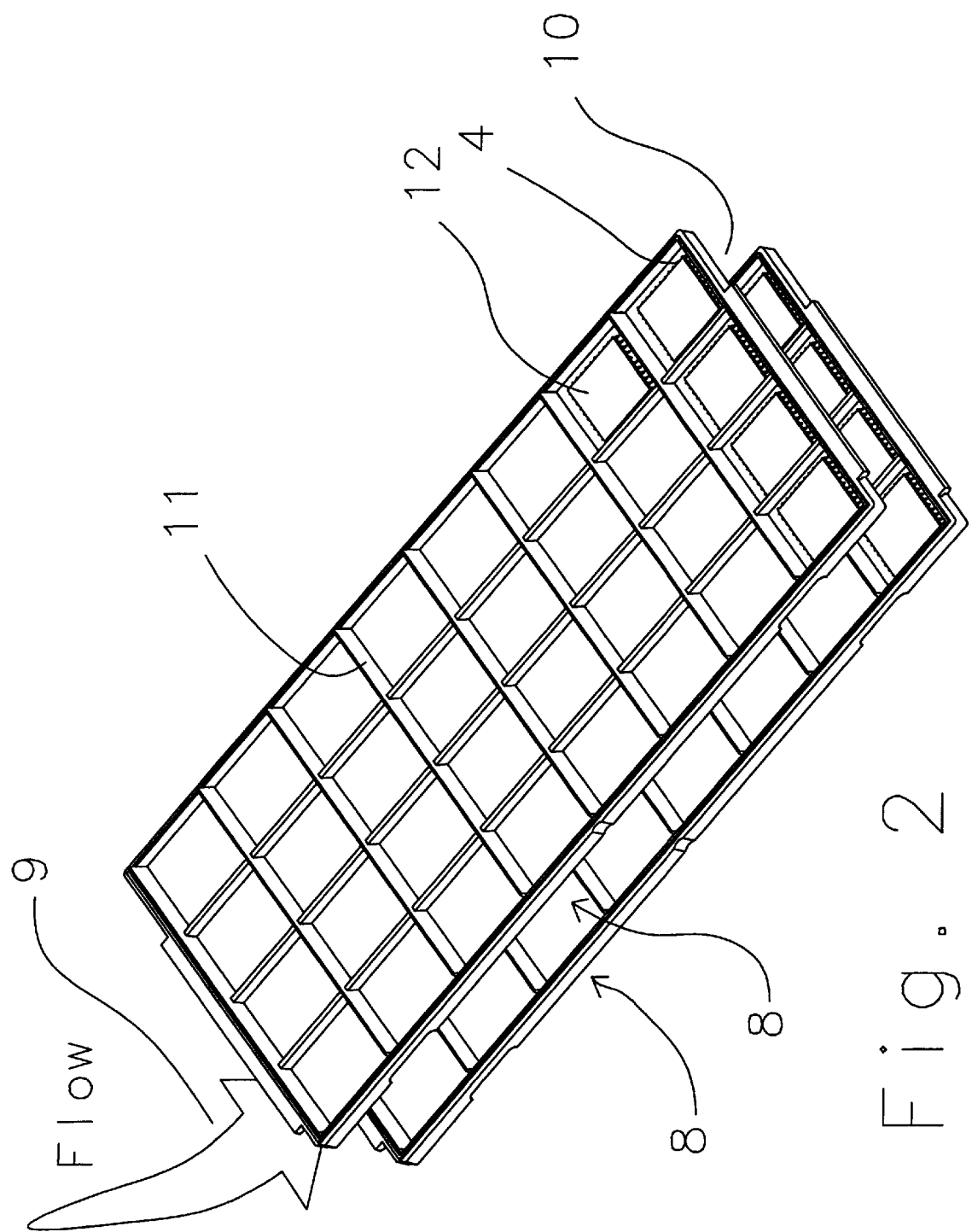
FIG. 2 is a perspective view of the present invention applied as ribs to two trays spaced apart with an arrow indicating the direction of air flow between the trays.

Thermal conditioning of devices in trays with forced convection can be accomplished by blowing some fluid, preferably air, over or against the trays. The preferred means is depicted in FIG. 2, which shows two semi-populated trays 8 forming potentially a series of multiple-spaced trays subject to air flow 9. These two trays are spaced apart, so that space 10 between the trays forms a passage. Here, the present invention includes special ribs 11 that extend a specified height above top surfaces 12 of ICs 4.

The optimum height of ribs 11 above top surfaces of ICs 4 depends on many factors. Making the ribs higher increases the thermal transfer to the IC. Thus, higher ribs will be needed for thicker parts. However, if the ribs become too high, the air flow over the part becomes restricted and thermal transfer decreases. The point at which the ribs becomes too high depends in large measure on the air flow provided by a blower sending air over the part. In a preferred embodiment, ribs 11 extend more than 1 mm and less than 10 mm over the top surface of the part. More preferred ranges are more than 2 mm and less than 5 mm. For scale, these dimensions are appropriate for a tray that similar in size to a standard JEDEC tray, with overall dimensions of 315 mm×135.9 mm and a thickness of around 7.62 mm. However, trays of greater thickness are also possible.

Figure 3:
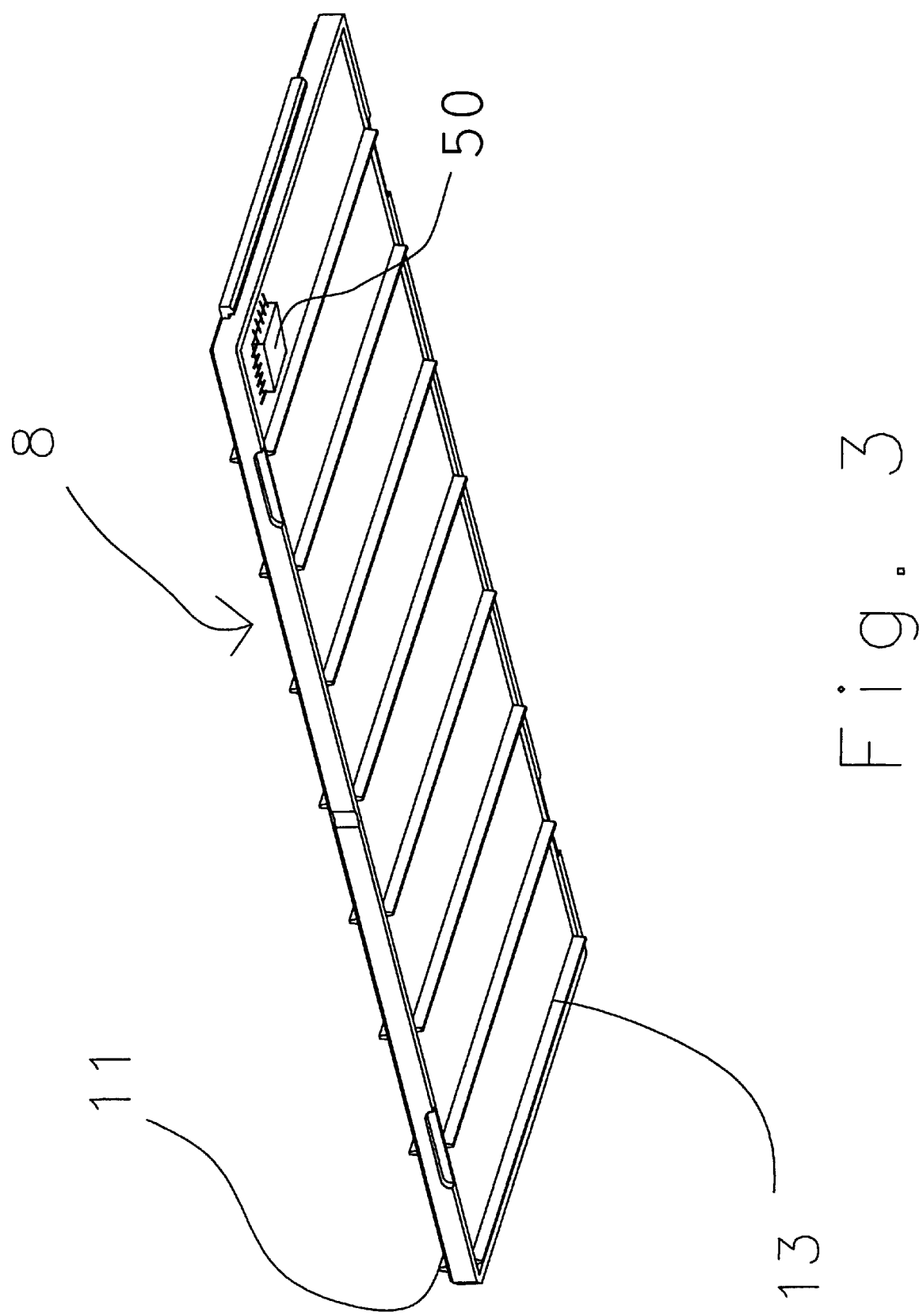
FIG. 3 is a perspective view of the present invention applied as ribs underneath a tray as well as on the top.

FIG. 3 illustrates another embodiment of the invention on JEDEC-type tray 8, where a series of ribs 13, similar to top-surface ribs 11 in geometry and function, are patterned underneath. The preferred orientation of ribs 11 and 13 for the intended purposes just described is perpendicular to the direction of the fluid flow. In most applications, the fluid-flow orientation will be in the longitudinal or transverse direction of the tray.

Figure 4:
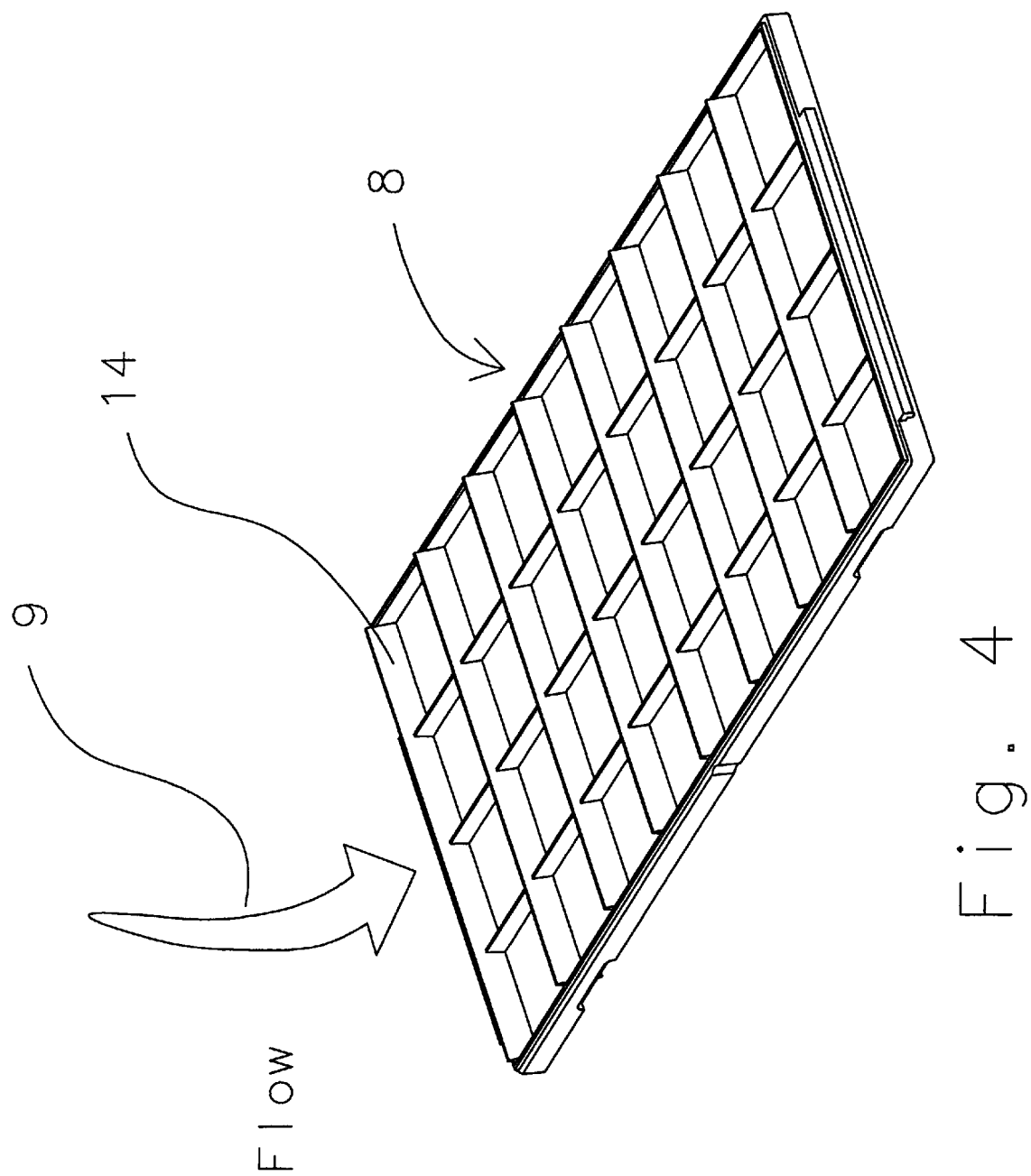
FIG. 4 is a perspective view of the invention on a tray as ribs in the transverse direction.

FIG. 4 depicts the invention as ribs 14 applied in the transverse direction of tray 8. Arrow 9 illustrates the direction of the flow, which is perpendicular to ribs 14.

Figure 5:
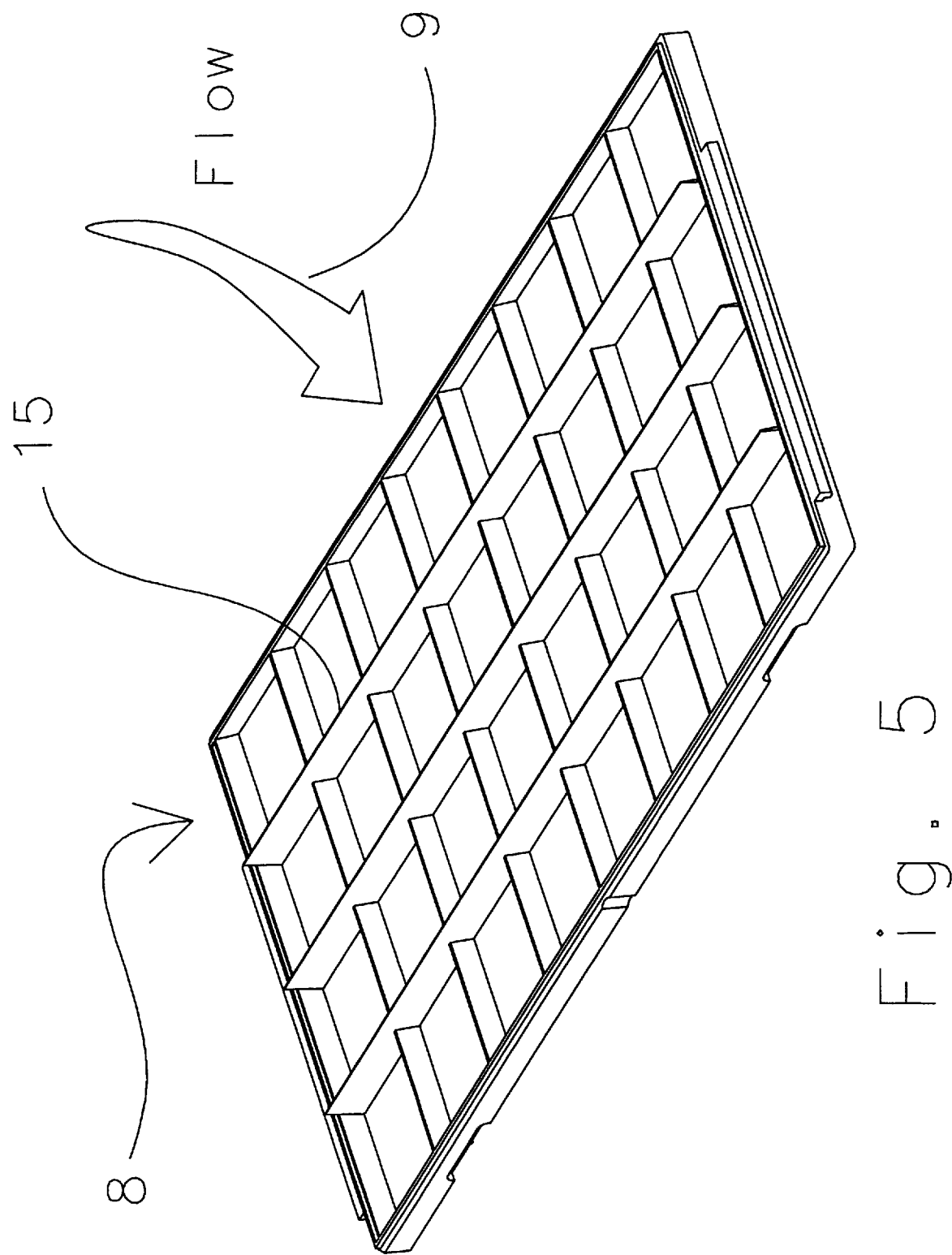
FIG. 5 is a perspective view of the invention on a tray as ribs in the lengthwise direction.

In FIG. 5, the invention is applied as ribs 15 oriented in the longitudinal direction of tray 8. This orientation can be more advantageous than the one in FIG. 4 because the distance for the flow to traverse is shorter, which has mostly an effect on keeping the overall temperature change of the flow across the tray small. The exact layout and geometric size of any embodiment of the invention as ribs on a carrier impacts the heat transfer enhancement to the carrier and to the devices.

Figure 6:
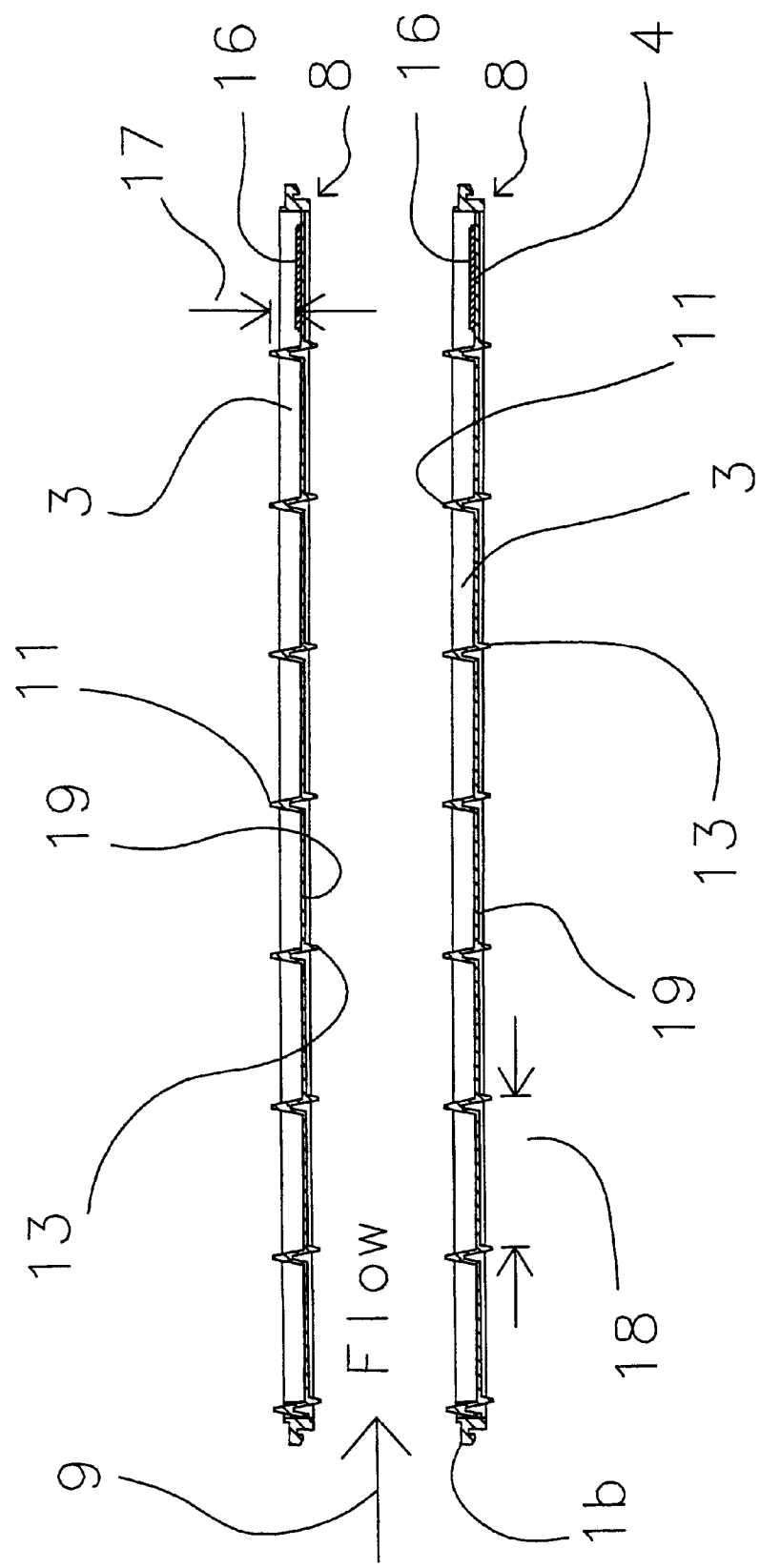
FIG. 6 is a cross-sectional view of two spaced trays with the present invention applied as ribs with key dimensions marked.

Referring to FIG. 6, a cross-sectional view of tray 8 is depicted that is necessary to understand the discussion of how the ribs enhance the heat transfer. A turbulent flow is characterized by a process of mixing, and the efficiency of heat transfer is a function of this amount of turbulence or mixing. Because of the physical nature of a flow that is contained within boundaries, the degree of mixing is typically greatest in the center and less near the perimeter. Therefore, the intention with top-surface ribs 11 is focused on enhancing the mixing between fluid close to exposed surface 16 of devices 4 and the fluid in the center of the flow passageway between adjacent trays 8. A consequence of this enhanced mixing is an increase in the convective heat transfer. Relative distance 17, which is from top or exposed surface 16 of device 4 to the top of the surface of rib 11, and pitch or distance 18 between the ribs are design variables that directly impact the amount of mixing enhancement, which again translates to the degree of heat-transfer enhancement.

Still referring to FIG. 6, bottom-surface ribs 13 also function to enhance the heat transfer in a similar manner. However, as depicted, the heat-transfer enhancement is to the tray, since the exposed surface is underside 19 of tray pockets 3. Additional heat transfer to the device may then consequently result by conduction of heat through the tray, because the tray is in direct contact with the device. It is understood that the embodiment shown can be varied in such a way that bottom-surface ribs 13 directly enhance the convection heat transfer to the device by leaving a cutout 50 (FIG. 3) in the pocket base.

Figure 7:
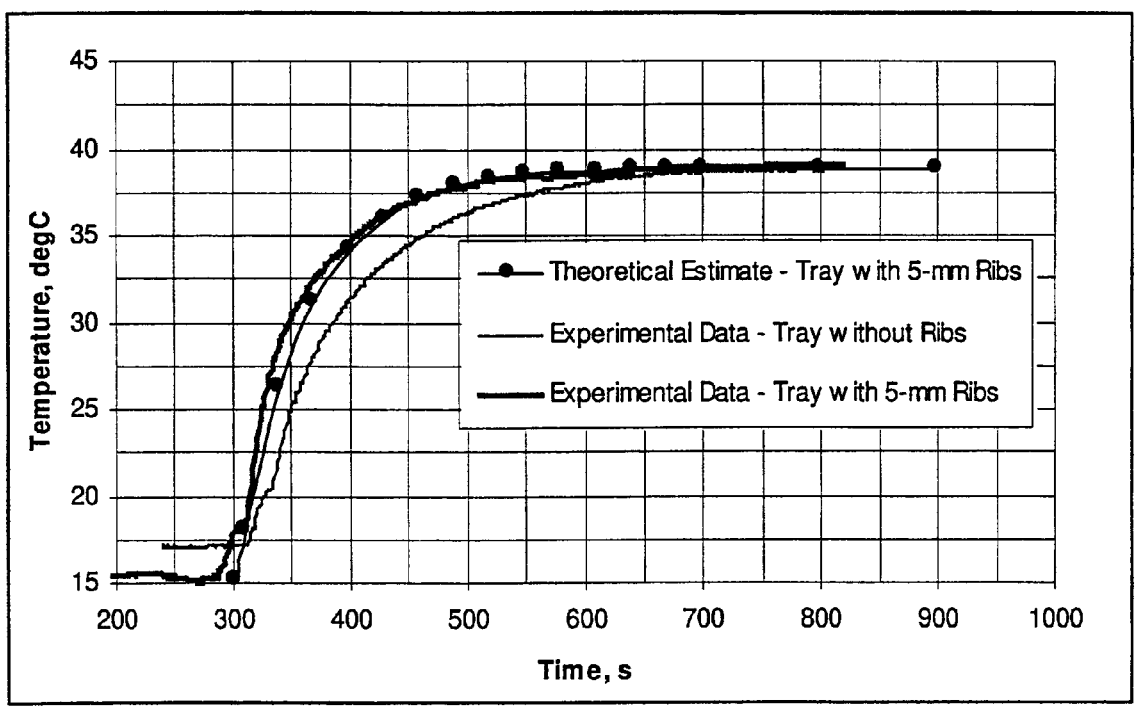
FIG. 7 are plots of predicted and experimental thermal responses of a plastic, 1-mm thick IC subject to a turbulent air flow.

It was experimentally found by the inventors that the thermal response times of devices thermally conditioned in this fashion can be estimated analytically using methods derived from work published by Han, J. C., "Heat Transfer and Friction in Channels With Two Opposite Rib-Roughened Walls," Transactions of the ASME, vol. 106, November 1984, pp. 774–781. As an example, consider two trays spaced 2.4 cm apart, each with 5-mm ribs on top and underneath, and at a 2.5 cm pitch. The resulting predicted and experimental thermal response of a typical thin-packaged IC is illustrated in FIG. 7. The calculations are based on the experimental flow rate between trays of 25.5 cubic feet per minute and a Reynolds number of 9510. The Reynolds number is a ratio of the inertial forces to the viscous forces of a flow, giving an indication of the flow regime; e.g., laminar, transitional or turbulent channel flows having Reynolds numbers above 2300 can generally sustain turbulence. Thus, in the preferred embodiments, the Reynolds numbers would preferably be above 2300. In some embodiments, the Reynolds number is above 5000 and could, for some embodiments be above 10,000.

Figure 8:
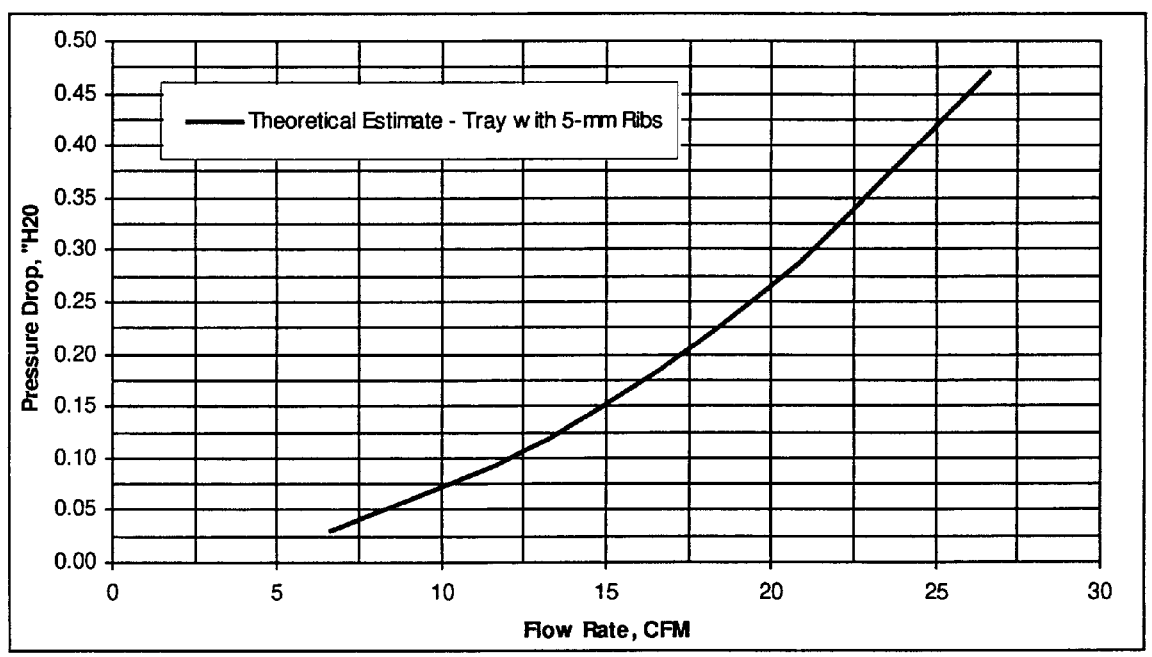
FIG. 8 are plots of pressure drop curves for air flow through two ribbed, spaced trays.

As a consequence of the heat transfer enhancing surface features, a pressure-drop penalty is incurred, although it is usually small enough to still warrant application of such ribbing. FIG. 8 illustrates the corresponding system performance curves, showing the pressure drop versus flow rate across the length of the passage formed by the two trays being considered. The Reynolds numbers corresponding to the plotted range is from 2500 to 10,000, which implies a sufficiently turbulent flow. In the design, a blower performance curve would be overlaid on these curves to determine operating points, which are the intersection of the blower curve with the system curve. In practical cases, other pressure losses, such as from ducts and filters, must be accounted for and included in the calculation of the system performance curve.

The embodiments in the previous figures illustrate the invention as ribs extending beyond the upper and lower bounds of the tray frame. This excessive extension may not occur in every embodiment of the invention, because the extension depends on the overall height of the frame. Nonetheless, these two embodiments illustrate possible limitations to the rib heights when the trays need to be stacked one on top of one another.

Figure 9:
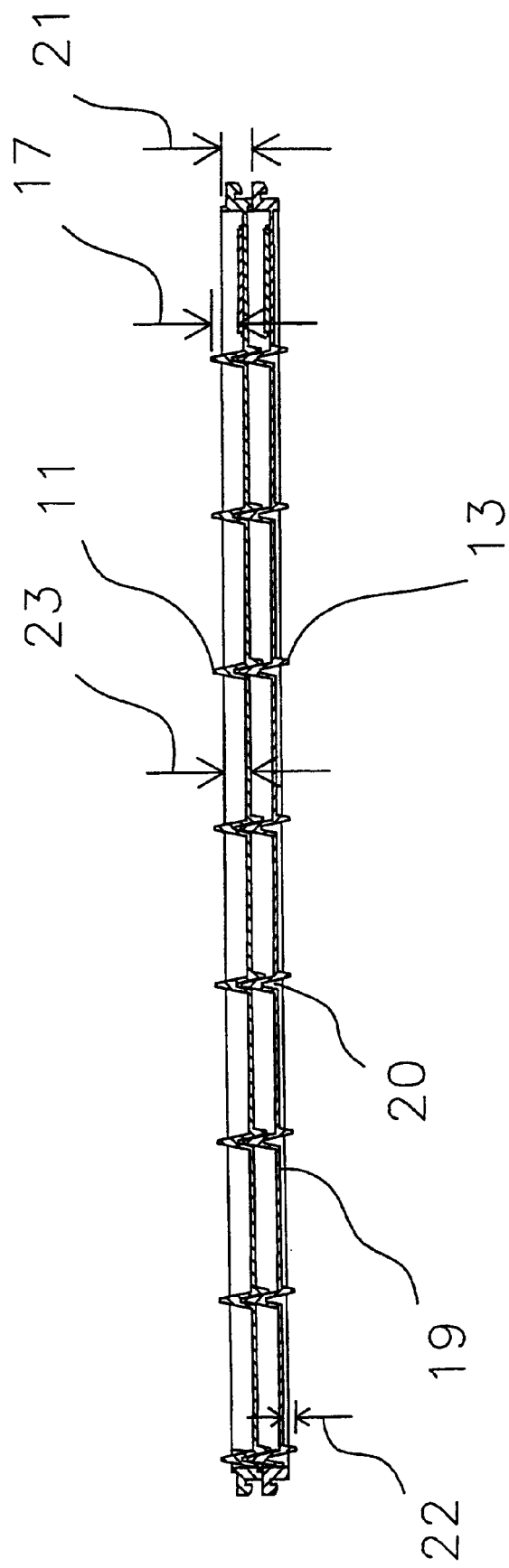
FIG. 9 is a cross-sectional view of two stacked trays with the invention applied as ribs to each tray in the transverse direction.

Referring to FIG. 9, such ribs that protrude above or below the defined outer frame or outline of the tray are accommodated by staggering upper and lower ribs 11 and 13, respectively, and forming cavity 20 underneath top ribs 11. This cavity allows top ribs 11 of the tray below to fit underneath. For fixed tray-frame height 21, there exists a maximum limit to top rib height 17 and bottom-rib height 22 in order to allow stacking. This limit is also a function of pocket depth 23 and of the support structure or base 19 in the pocket.

In many manufacturing processes, semiconductor trays are used in only one machine, where it may not be necessary to provide such stacking features. There also exists the option of not conforming to JEDEC standards, allowing the tray frame and the ribbing of the present invention to be constructed to any specified dimensions.

Figure 10:
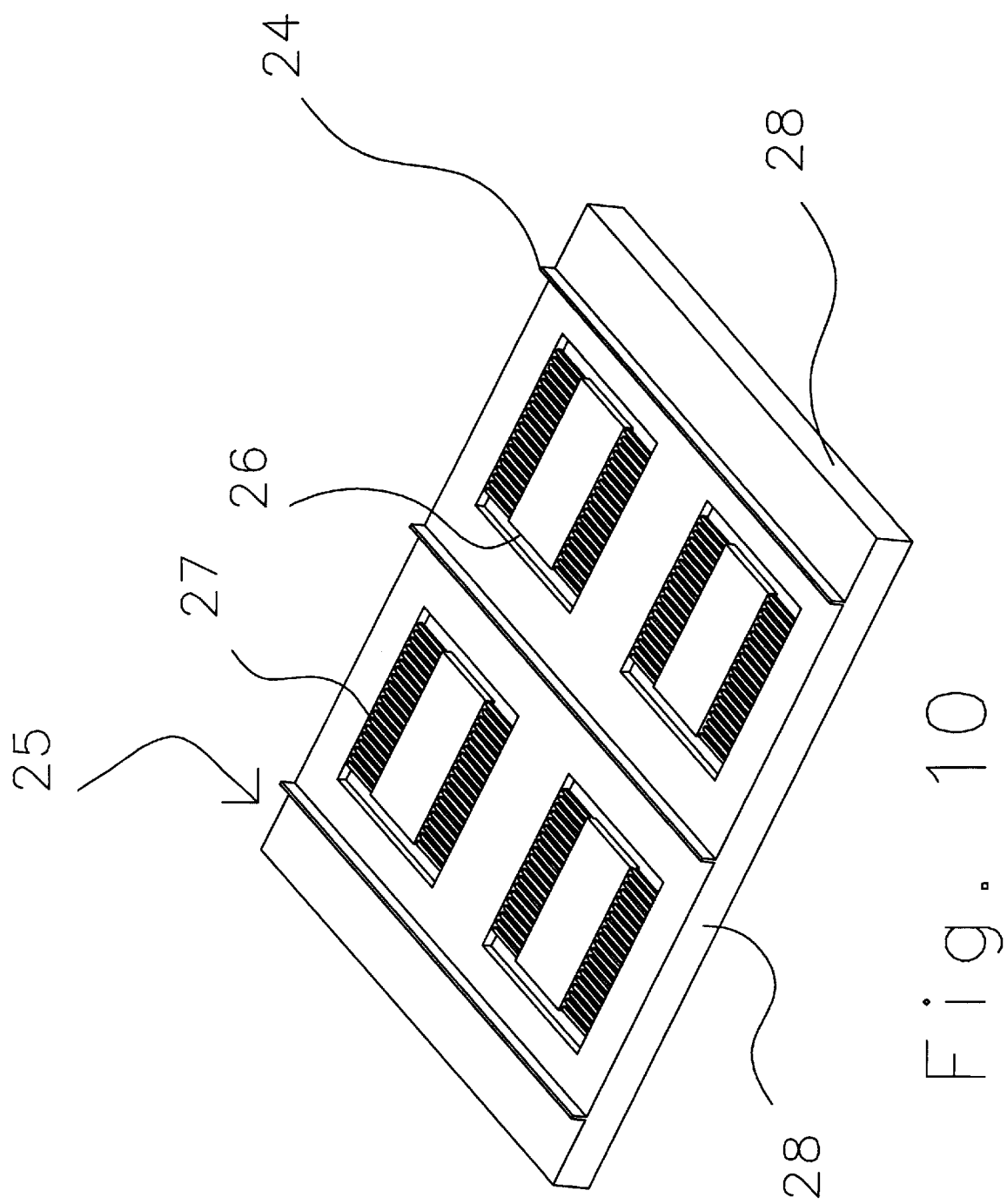
FIG. 10 is a perspective view of the invention applied as ribs to a lead frame in the transverse direction.

It is therefore understood that the embodiments of the invention presented can be applied to any form, size or material of an IC carrier. FIG. 10 illustrates an embodiment where the ribbing 24 is applied to conventional lead frame 25, on which chips can be placed. By leaving ICs 26 in the lead frame, they can continue to undergo additional manufacturing processes, such as testing processes, without having to be transferred into special tray carriers. It is understood that there exist numerous methods for keeping the IC in the lead frame while separating leads 27 for electrically isolating the individual ICs. In this embodiment, front and side edges 28 of the lead frame are bent downward to provide extra stiffness and rigidity. These characteristics of the lead frame are only provided to illustrate an example of a lead frame.

Figure 11:
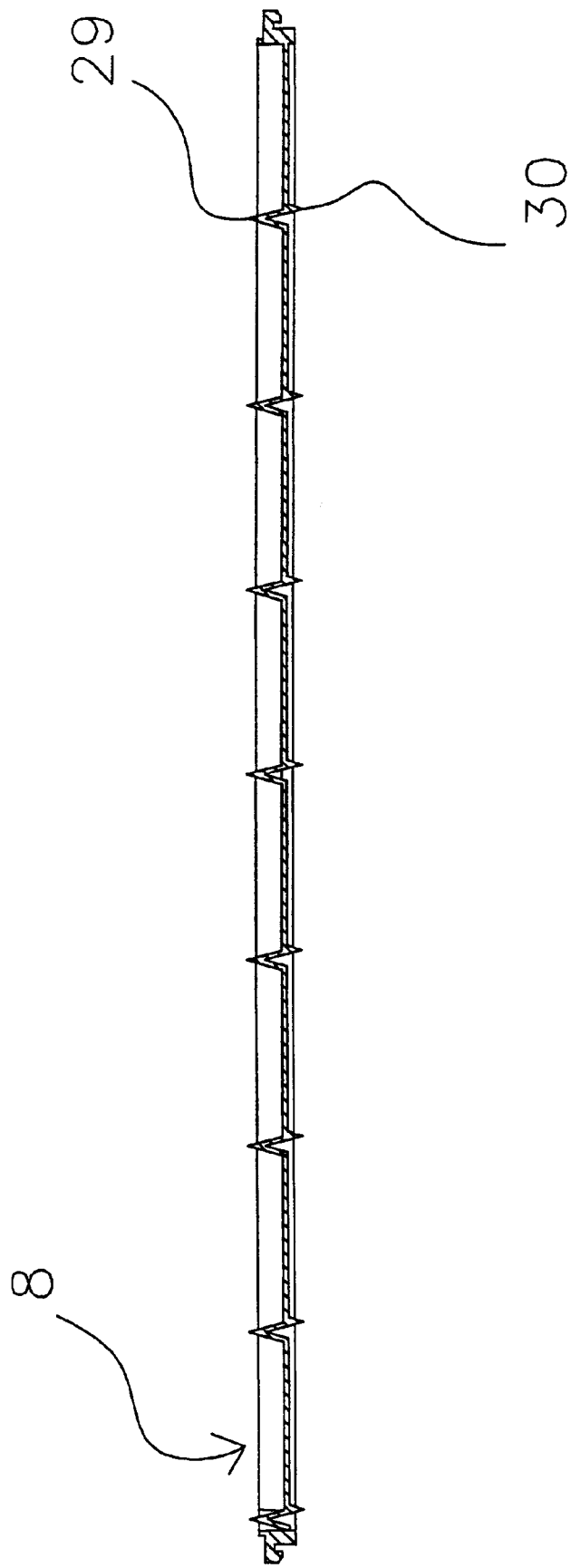
FIG. 11 is a cross-sectional view of the invention applied as triangular shaped ribs to a tray in the transverse direction.
Figure 12:
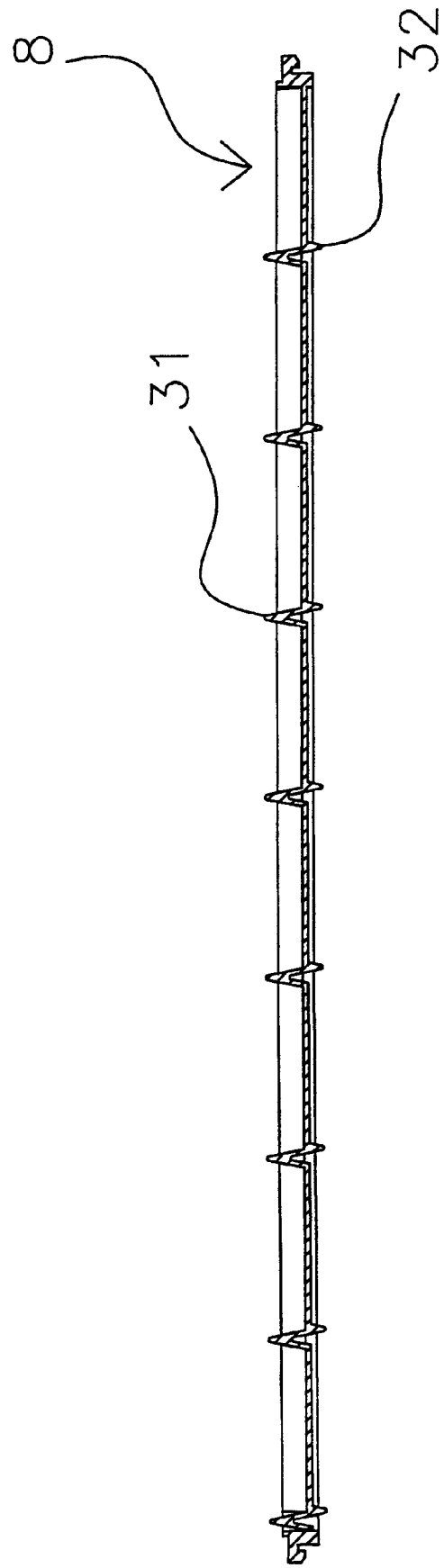
FIG. 12 is a cross-sectional view of the invention applied as rounded ribs to a tray in the transverse direction.

It is further understood that the embodiments of the invention presented can be varied in such a way that the shape of the rib can take on any practical form. FIG. 11 illustrates such an embodiment where top and bottom ribs 29 and 30, respectively, on JEDEC-type tray 8, are triangular. FIG. 12 illustrates such an embodiment where top and bottom ribs 31 and 32, respectively, on JEDEC-type tray 8 are rounded.

Figure 13:
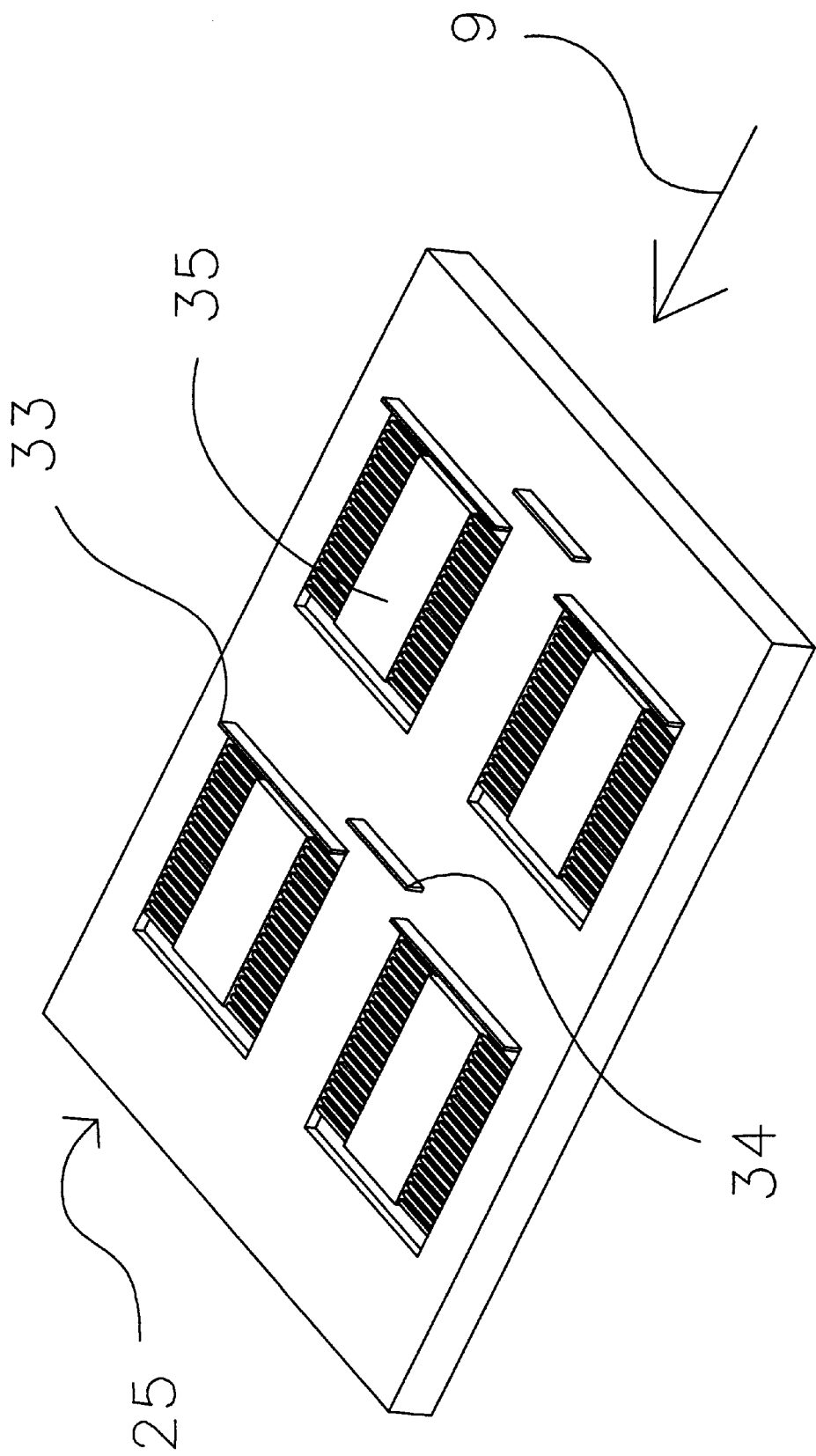
FIG. 13 is a perspective view of the invention applied to a lead frame as segmented and staggered ribs to illustrate the flexibility in locating the ribs.

It is further understood that the embodiments of the invention presented can be varied in such a way that the heat-transfer enhancing ribs can be segmented, allowing them to be placed anywhere on a tray. As an example, FIG. 13 illustrates lead frame 25 with ribs 33 mounted before the location of each unformed device 35 and with ribs 34 mounted at a different location offset from the ribs 33. Arrow 9 indicates the direction of the flow, which is perpendicular to ribs 33 and 34.

It is further understood that the embodiments of the invention presented can be varied in such a way that any practical materials can be used. For trays, the preferred material is a high-temperature, statically dissipative plastic that allows for low manufacturing costs and keeps structural integrity at high temperatures. An example is the common carbon-filled polyether sulfone, PES.

Figure 14:
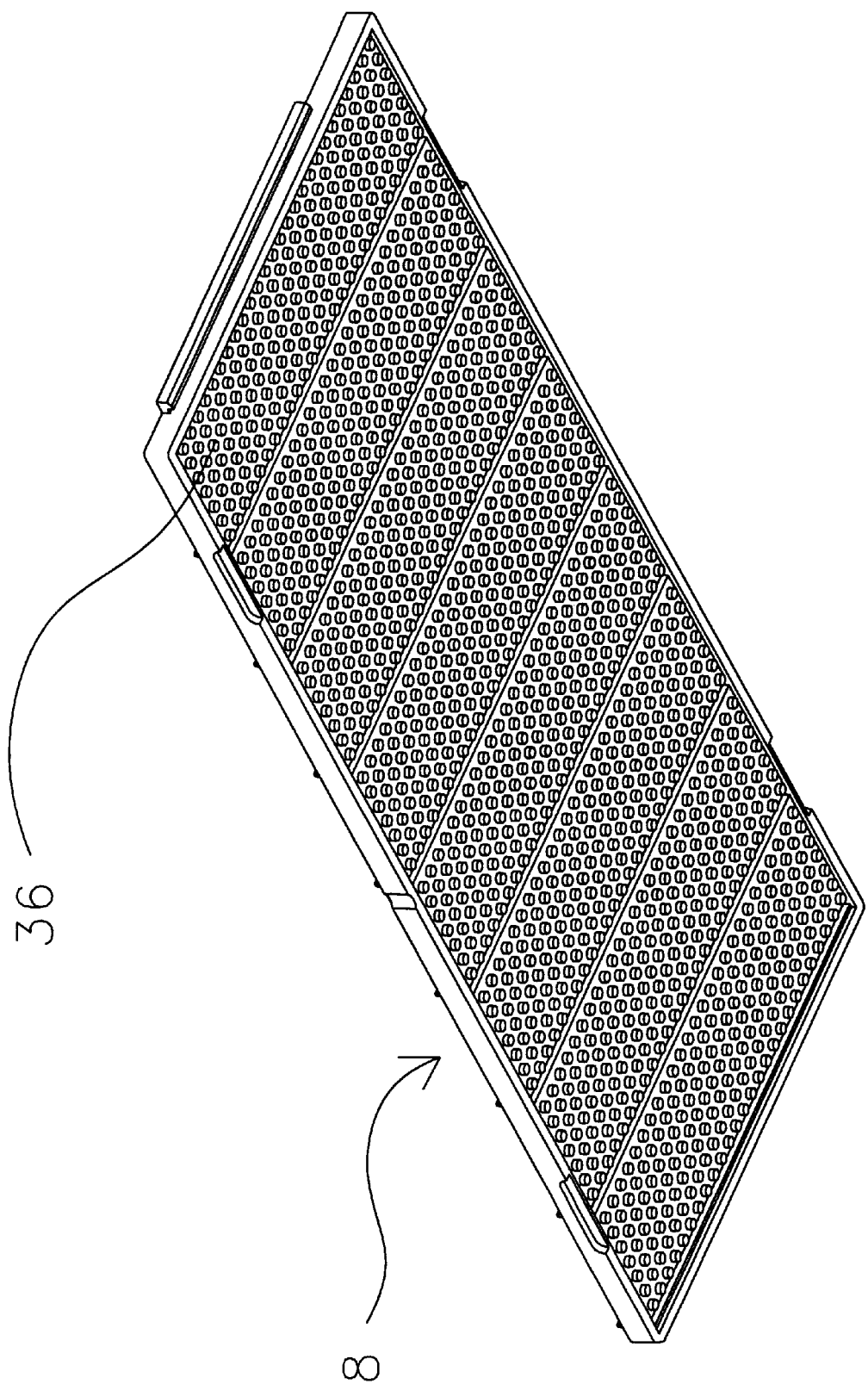
FIG. 14 is a perspective view of the invention applied to the underneath surface of a tray as a surface roughness.

The next embodiment illustrates how thermal soak time can be reduced with a designed-in roughness on surfaces of a carrier or tray. Referring to FIG. 14, an embodiment is shown where a surface roughness is applied to underside 36 of JEDEC-type tray 8. It is understood that this embodiment can be varied in such a way that the roughness can be incorporated as a true geometric pattern, as shown, or simply a random rough surface generated by a rough-surface mold, for example. Oftentimes, a rough surface is compared to the texture of sandpaper, although in this application the roughness can be orders of magnitude larger. An estimate of the influence of the roughness size can be calculated using methods described in Mills, A. F., *Heat Transfer*, Irwin, Boston, Mass., 1992, for rough surface turbulent duct flows.

Figure 15:
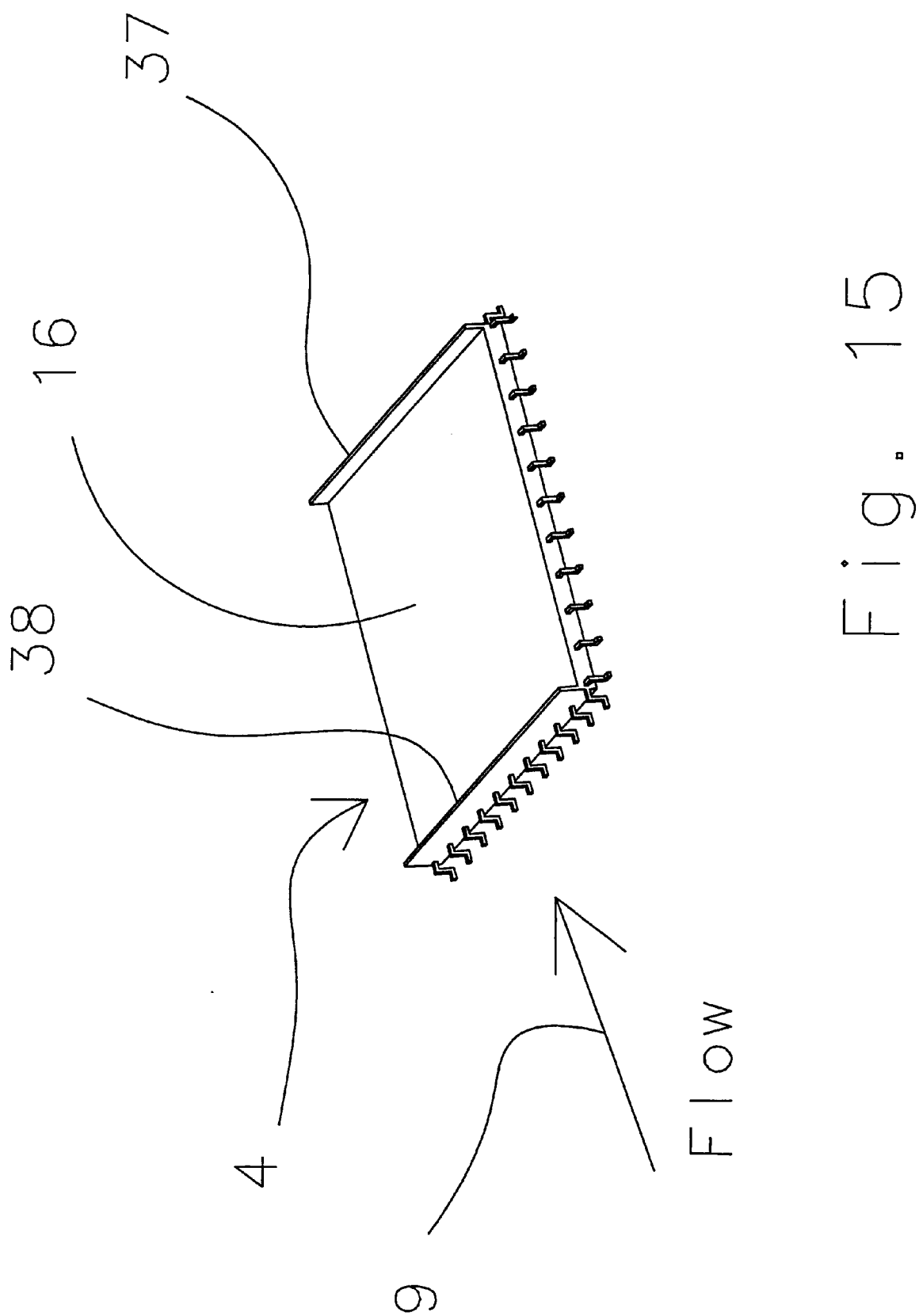
FIG. 15 is a perspective view of the invention applied to an IC as ribs on the top surface.

The next embodiment considers how thermal soak time can be reduced through the use of ribs on a device package. FIG. 15 illustrates two protruding ribs 37 and 38 standing off from surface 16 of IC 4 considered earlier. The function, design, and embodiments of such ribs 37 and 38 are similar to the invention as applied as ribs to an IC carrier. Ribs 37 and 38, for example, can be applied to either the top or bottom surfaces and are oriented perpendicular to flow 9. However, the application on the underside is unlikely, because of the insufficient distance between the IC and the mounting surface of its application. Usually, but not always, the ICs are surface-mounted devices. On the other hand, ribs on the top surface of a device can be more easily accommodated. Moreover, by locating the ribs near the edges of the device package, ample flat-surface area can remain for pick-and-place machines to individually handle the devices with suction cups or similar gripping techniques.

Figure 16:
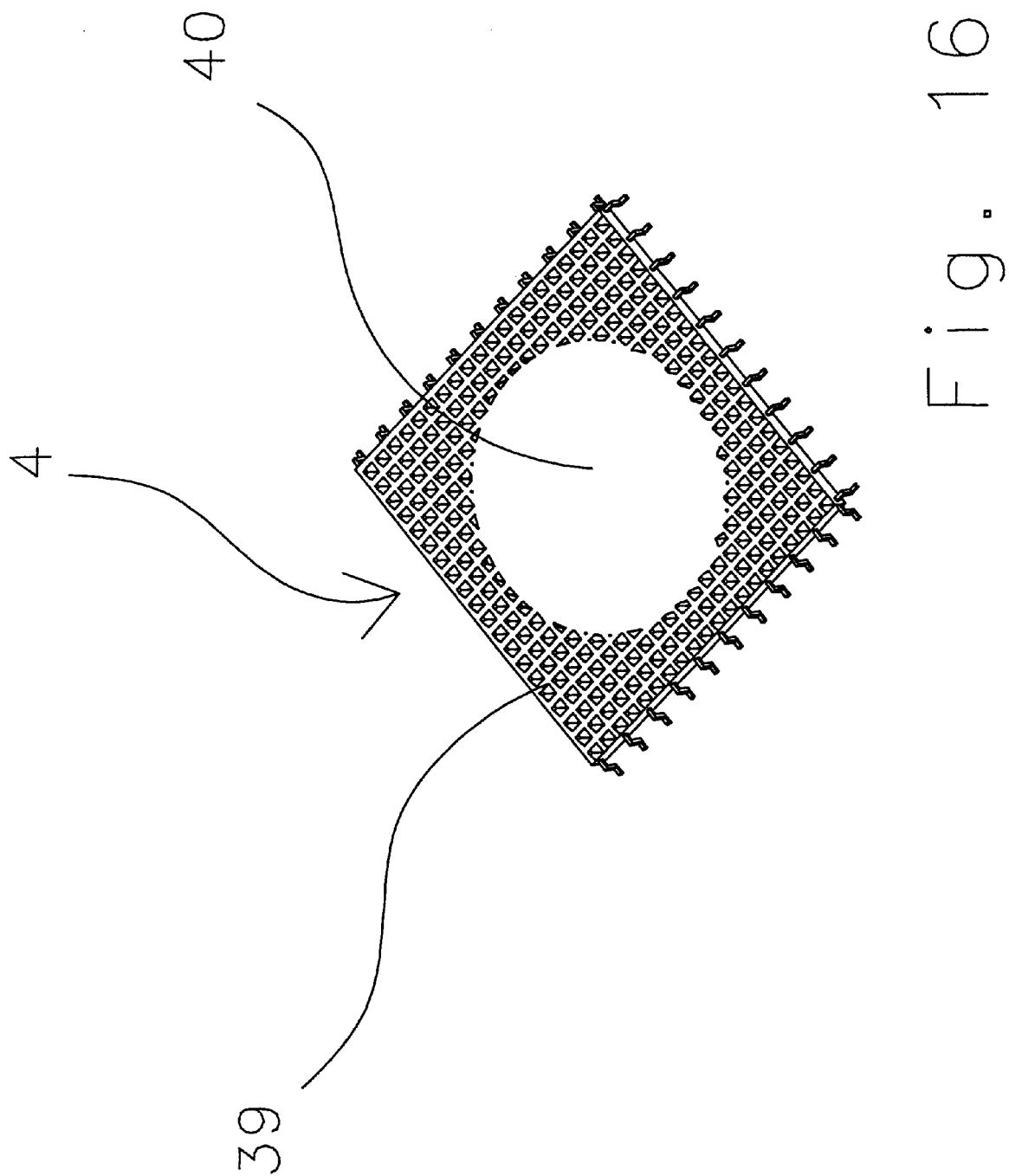
FIG. 16 is a perspective view of the invention applied to an IC as a surface roughness on the top surface with a circular smooth region.

Other embodiments illustrate improved how thermal soak time can be reduced with a designed-in roughness on a surface of a device exposed to a flow. FIG. 16 depicts severely roughened surface 39 of semiconductor IC package 4. Region 40 is left flat so that a vacuum gripper can pick up the IC. In an established turbulent flow, proper roughness height is sufficiently tall to enhance fluid mixing and/or disrupt heat-transfer reducing flow layers that develop near the surface. In the applications being considered, this height typically ranges from fractions of a millimeter to many millimeters, but can be greater or smaller. In a preferred embodiment, the features will be above 0.5 mm and below 10 mm. More preferably, the features will be above 1 mm in height and most preferably above 2 mm. The features will most preferably be below 5 mm.

Figure 17:
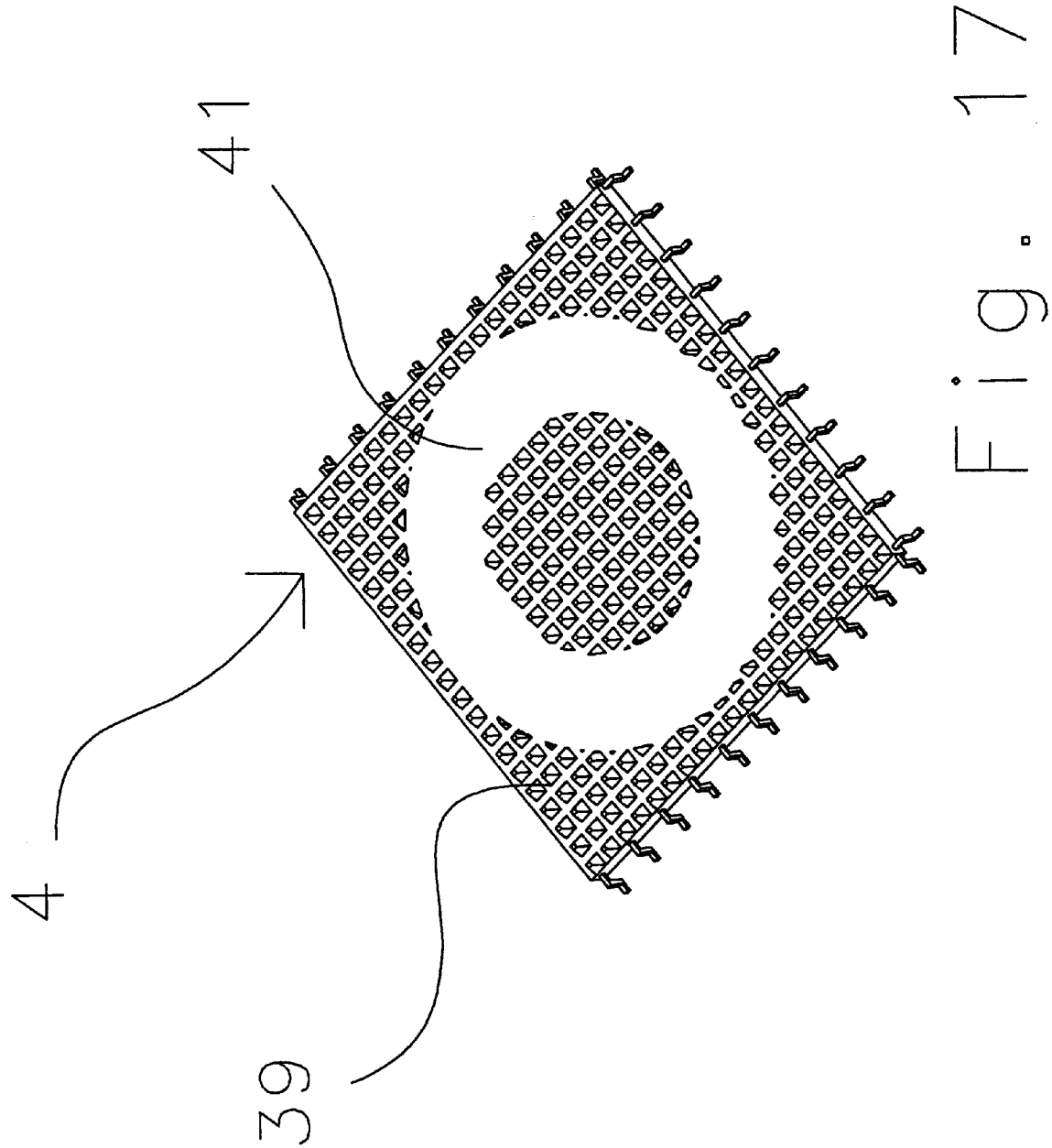
FIG. 17 is a perspective view of the invention applied to an IC as a surface roughness on the top surface with an annular smooth region.

The surfaces that are roughened would be the ones exposed to the flow. Both top and bottom surfaces can be roughened, in cases where the device might be supported on the perimeter or corners of the package. It is understood that smooth region 40 can take the form of any shape or, if desired, not exist at all. For example, FIG. 17 depicts IC 4 with surface roughness 39 having annular smooth region 41 to allow for a vacuum gripper to pick up the chip while minimizing the area left unroughened.

It is understood, also, that the present invention as disclosed in all the prior embodiments and the possible variations does not have to be integrally manufactured to the device or tray. The present invention in any embodiment can exist as separate entity and be fastened, bonded or mounted to the device or tray.

To reiterate, applying a surface roughness or ribbing to decrease thermal soak time by promoting non-laminar flow is fundamentally different from one of integrating or applying fins to a surface—the surface roughness is applied to enhance or induce convective heat transfer. Fins are applied to enhance heat transfer by increasing the surface area of an object from which convection occurs. This is why these fins or heat sinks are often referred to as extended surfaces. The heat-transfer fundamentals that explain the engineering details of this difference can be found in many heat-transfer textbooks, such as the one mentioned above by Mills.

Figure 18:
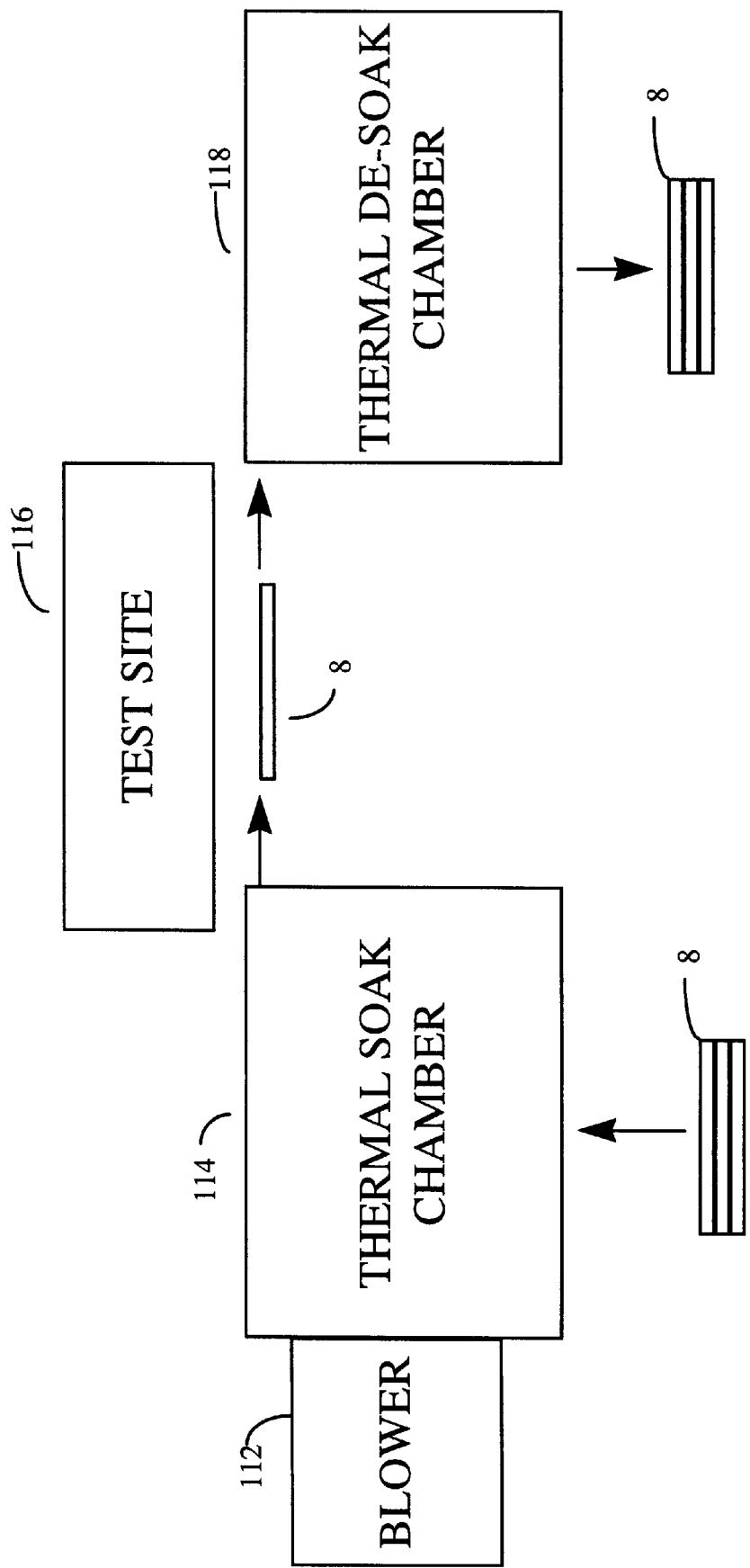
FIG. 18 is a sketch, in simplified block diagram form, of a handler used in conjunction with trays of semiconductor devices.

FIG. 18 shows a "handler" designed to operate with trays of semiconductor chips incorporating features to enhance thermal transfer efficiency. In operation, a stack of trays 8 is presented to a thermal soak chamber 114. The trays 8 can be stacked as shown in FIG. 9. The handler incorporates mechanical devices for moving the trays between stages as in the prior art, and such mechanical devices are not explicitly shown.

Inside thermal soak chamber 114, the trays 8 are spaced apart as shown in FIG. 6. Air flow 9 (FIG. 6) is generated by blower 112. Where ribs are used, the airflow is perpendicular to the ribs. Blower 112 blows heated air in a preferred embodiment, but chilled air could be blown as well. The mechanical devices that move trays 8 through soak chamber 114 are not expressly shown, but they are as in the prior art. Such mechanical devices are controlled to keep each tray 8 inside thermal soak chamber 114 until all of the semiconductor devices in the tray reach the desired temperature.

Once the devices on a tray reach the desired temperature, that tray 8 is removed from thermal soak chamber 114 and presented to a test site 116. The test site is an interface to automatic test equipment, such as the J973 test system sold by Teradyne, Inc. of Agoura Hills, Calif. Once the devices are tested, the tray 8 is optionally passed to a thermal de-soak chamber 118. Thermal de-soak chamber 118 provides a place where the trays and devices in them can return to ambient temperature. Thermal de-soak is optional and its use depends in large measure on the temperature to which the devices are elevated during testing. The trays 8 are removed from thermal de-soak chamber 118 and again stacked as in FIG. 9.

In a preferred embodiment, thermal soak chamber will hold several trays 8 simultaneously. As one tray is taken out for testing, another tray is added. The trays queue up inside thermal soak chamber 114 so that multiple trays can heat up at one time, thereby increasing throughput. However, the number of trays that needs to be simultaneously in soak chamber 114 in order to achieve a specific throughput decreases in proportion to the rate at which the devices in the trays heat up. Thus, because the invention increases the rate at which semiconductor devices heat up, fewer trays need to be inside thermal soak chamber 114 at one time. The size of thermal soak chamber 114, and hence the overall size of the handler, can thus be reduced.

Of course, the invention might be used to make other types of semiconductor processing equipment smaller or faster.

Therefore, the invention should be limited only by the spirit and scope of the appended claims.

What is claimed is:

1. A tray used for carrying and thermally conditioning a plurality of semiconductor devices, comprising:

(a) a frame defining a space;

(b) a network of ribs formed in the space, for defining a plurality of substantially rectangular pockets, each pocket having a central portion; and (c) a planar base formed in the central portion of each pocket, for supporting one of the plurality of semiconductor devices, wherein the network of ribs includes a first plurality of ribs and a second plurality of ribs, each rib in the first plurality being substantially orthogonal to the ribs in the second plurality, and wherein each rib in the first plurality extends a specified height above the ribs in the second plurality, thereby enhancing convective heat transfer to or from the tray and the semiconductor devices when a fluid flows over the tray and perpendicularly to the first plurality of ribs.

2. The tray as recited in claim 1, wherein the frame includes an upper edge, and wherein the specified height is above the upper edge of the frame.

3. The tray as recited in claim 1, further comprising a third plurality of ribs, each rib in the third plurality extending down perpendicularly to the plane of the bases and extending parallel to the ribs in the first plurality.

4. The tray as recited in claim 3, wherein the frame further includes a lower edge, and wherein each downward extending rib extends beyond the lower edge of the frame.

5. The tray as recited in claim 4, wherein the first plurality of ribs and the third plurality of are staggered, thereby forming a cavity underneath each rib in the first plurality.

6. The tray as recited in claim 5, wherein each cavity receives one of the ribs in the first plurality of another tray, thereby allowing stacking of trays.

7. The tray as recited in claim 3, wherein each base includes a cutout for exposing a bottom surface of a respective supported device under test.

8. The tray as recited in claim 3, wherein each rib in the first plurality and each rib in the third plurality has a triangular shape.

9. The tray as recited in claim 3, wherein each rib in the first plurality and each rib in the third plurality has a rounded shape.

10. The tray as recited in claim 1, wherein the specified height is greater than 1 mm and less than 10 mm.

11. The tray as recited in claim 10, wherein the specified height is greater than 2 mm and less than 5 mm.

* * * * *